United States Patent
Terazawa et al.

(10) Patent No.: US 7,092,313 B2
(45) Date of Patent: Aug. 15, 2006

(54) SEMICONDUCTOR INTEGRATED CIRCUIT

(75) Inventors: Toshihiro Terazawa, Kanagawa (JP);
Yoshinori Watanabe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 10/929,583

(22) Filed: Aug. 31, 2004

(65) Prior Publication Data

US 2005/0094446 A1   May 5, 2005

(30) Foreign Application Priority Data

Sep. 26, 2003   (JP) .............................. 2003-335561

(51) Int. Cl.
*G11C 8/00* (2006.01)

(52) U.S. Cl. ...................................... 365/233; 365/194

(58) Field of Classification Search ................ 365/233, 365/194; 327/293, 57
See application file for complete search history.

(56) References Cited

U.S. PATENT DOCUMENTS

| | | | |
|---|---|---|---|
| 5,726,950 A * | 3/1998 | Okamoto et al. | 365/233 |
| 6,091,663 A * | 7/2000 | Kim et al. | 365/233 |
| 6,111,448 A | 8/2000 | Shibayama | |
| 6,525,587 B1 | 2/2003 | Makino | |
| 6,791,370 B1 * | 9/2004 | Morzano | 327/57 |
| 6,930,953 B1 * | 8/2005 | Heragu et al. | 365/233 |

\* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor integrated circuit disclosed herein, comprises a first core which realizes a predetermined function; a second core which is different from the first core and realizes a predetermined function; a power supply circuit which is capable of supplying, to the first core, a power supply voltage different from that supplied to the second core; and a clock generating circuit which supplies a clock signal to each of the first core and the second core, the clock generating circuit including a clock skew reducing circuit which reduces clock skew occurring between the clock signal in the first core and the clock signal in the second core.

11 Claims, 5 Drawing Sheets

SEMICONDUCTOR INTEGRATED CIRCUIT

CROSS REFERENCE TO RELATED APPLICATION

This application claims benefit of priority under 35 U.S.C.§119 to Japanese Patent Application No. 2003-335561, filed on Sep. 26, 2003, the entire contents of which are incorporated by reference herein.

BACKGROUND OF THE INVENTION

1. Field of the Invention

The present invention relates to a semiconductor integrated circuit, and particularly relates to a semiconductor integrated circuit which includes a clock supply system to reduce clock skew when multiple power supplies are used inside.

2. Related Background Art

Hitherto, the power supply voltages of sequential circuits and combinational circuits in one semiconductor chip have a fixed value. In some cases, however, to reduce power consumption, the power supply voltage of some block (hereinafter referred to as a core) is decreased. Moreover, the power supply voltage of the core may be changed depending on applications executed by this core. When the power supply voltage of the core is changed, the propagation delay of a clock supplied to the core is also changed, which leads to an increase in the clock skew of the entire one semiconductor chip.

FIG. 1 is a block diagram showing the connection relationship of a related semiconductor integrated circuit in a semiconductor chip. In the example in FIG. 1, the semiconductor integrated circuit includes a clock generating circuit 1, a core A, and a core B. The clock generating circuit 1 generates a clock signal and supplies the clock signal to the core A and the core B.

The core A and the core B are constituted by sequential circuits and combinational circuits, and it is assumed that data is delivered between the core A and the core B. Namely, the core means a constitutional unit to realize a predetermined function.

FIG. 2 is a block diagram showing the internal configuration of the clock generating circuit 1, FIG. 3 is a block diagram showing a clock supply system inside the core A, and FIG. 4 is a block diagram showing a clock supply system inside the core B.

An oscillation clock signal is outputted from a PLL circuit 10 included in the clock generating signal 1 in FIG. 2, and this clock signal is supplied to flip-flop circuits A11 and A12 of the core A through buffers A1 to A5 and supplied to flip-flop circuits B11 and B12 of the core B through buffers C1 and B1 to B5.

As can be seen from FIG. 1 to FIG. 4, hitherto, the power supply voltage is fixed in the semiconductor chip, and hence, propagation delays of the clock signal from the PLL circuit 10 to the flip-flop circuits A11, A12, B11, and B12 which are sequential circuits are also fixed. In other words, since delay values of the buffers A1 to A5 and B1 to B5 which are delay elements included in a clock system are fixed, a reduction in clock skew is realized by designing a clock signal supply system with consideration given to the propagation delays of the clock signal from the PLL circuit 10 to the flip-flop circuits A11, A12, B11 and B12 which are the sequential circuits.

When the power supply voltage of the core A is made variable, however, the delay values of the buffers A1 to A5 change, and accordingly the propagation delays of the clock signal to the flip-flop circuits A11 and A12 which are the sequential circuits change. This causes a problem that the propagation delays of the clock signal to the flip-flop circuits A11 and A12 and the propagation delays of the clock signal to the flip-flop circuits B11 and B12 cannot match.

SUMMARY OF THE INVENTION

In order to accomplish the aforementioned and other objects, according to one aspect of the present invention, a semiconductor integrated circuit, comprises:

a first core which realizes a predetermined function;

a second core which is different from the first core and realizes a predetermined function;

a power supply circuit which is capable of supplying, to the first core, a power supply voltage different from that supplied to the second core; and a clock generating circuit which supplies a clock signal to each of the first core and the second core, the clock generating circuit including a clock skew reducing circuit which reduces clock skew occurring between the clock signal in the first core and the clock signal in the second core.

DETAILED DESCRIPTION OF THE EMBODIMENTS

First Embodiment

A semiconductor integrated circuit according to this embodiment is designed in such a manner that when the power supply voltage of a part of cores is changed, clock skew between the core whose power supply voltage is changed and the core whose power supply voltage is not changed is reduced by changing the propagation delay of a clock signal simultaneously. Further details will be given below.

Figure 5:
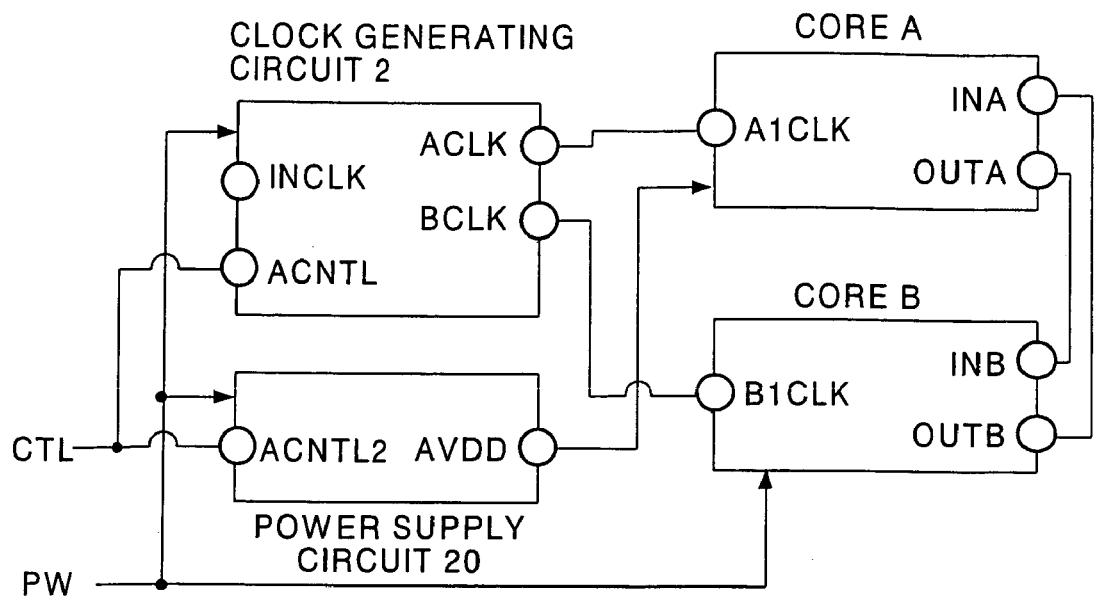
FIG. 5 is a block diagram showing the configuration of a semiconductor integrated circuit according to a first embodiment.

FIG. 5 is a block diagram showing the configuration of the semiconductor integrated circuit according to this embodiment. In the example in FIG. 5, the semiconductor integrated circuit includes a clock generating circuit 2, a power supply circuit 20, a core A, and a core B. These core A and core B are each a constitutional unit which realizes a predetermined function. Although FIG. 5 shows two separate cores, plural cores more than two may be provided.

Figure 1:
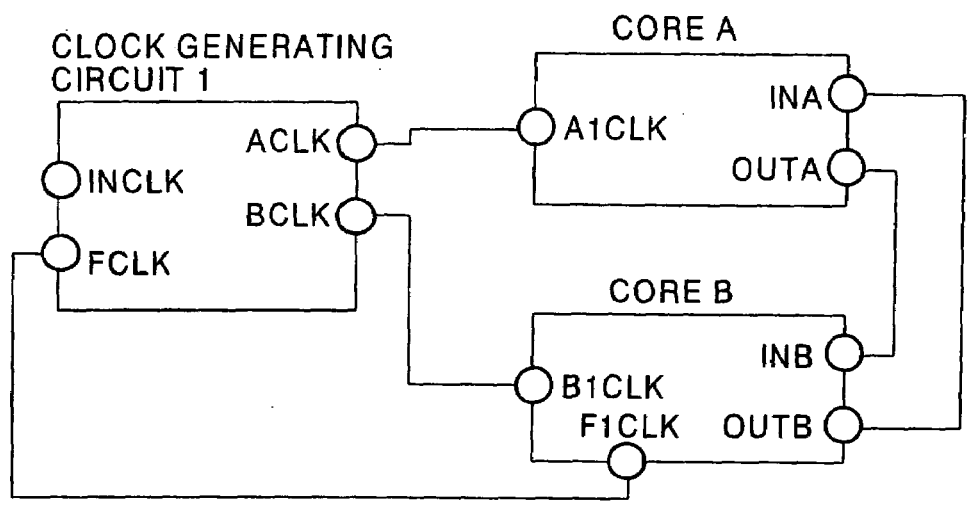
FIG. 1 is a block diagram showing the circuit configuration of a related semiconductor integrated circuit.
Figure 2:
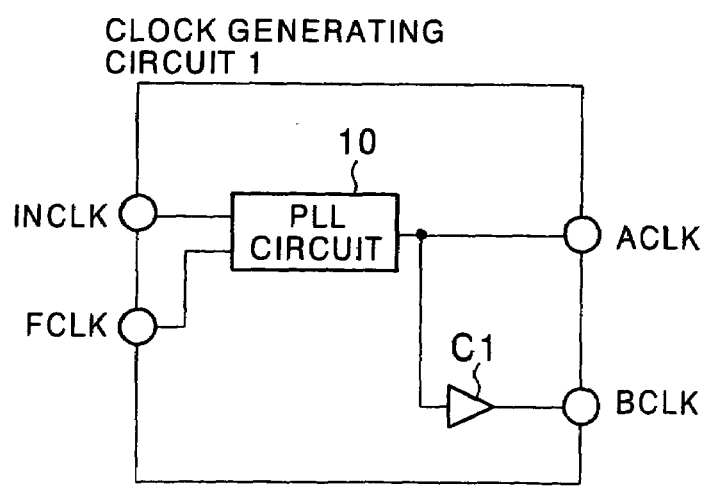
FIG. 2 is a block diagram showing the configuration of a clock generating circuit in the related semiconductor integrated circuit.
Figure 3:
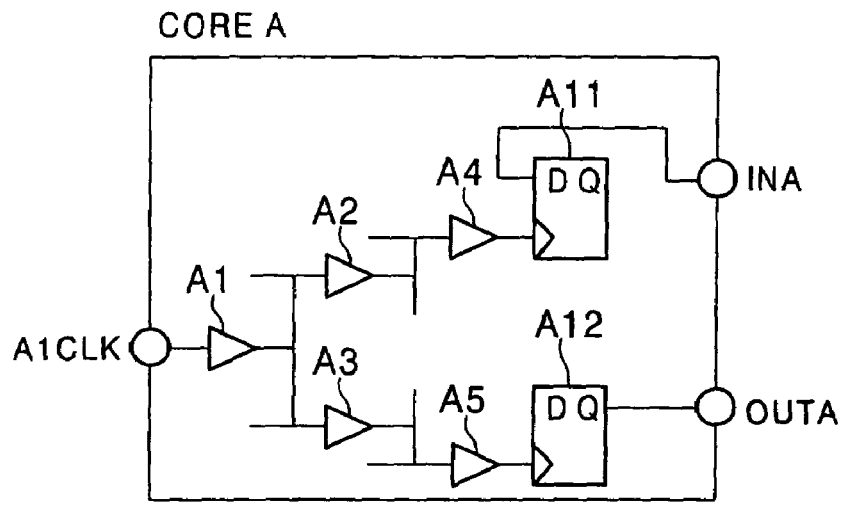
FIG. 3 is a block diagram showing a clock supply system inside one core in the related semiconductor integrated circuit.
Figure 4:
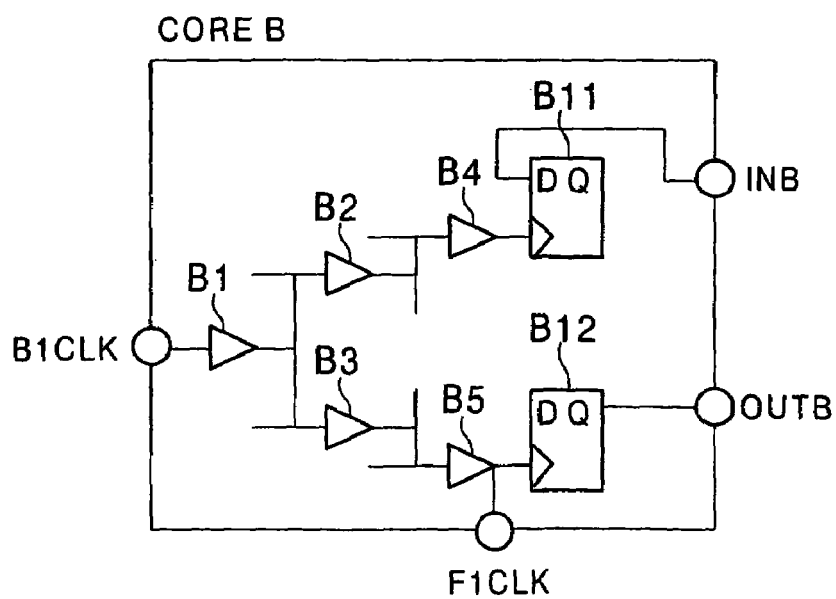
FIG. 4 is a block diagram showing a clock supply system inside another core in the related semiconductor integrated circuit.

The clock generating circuit 2 generates a clock signal and supplies the clock signal to the core A and the core B. Namely, a high-frequency signal is inputted to an input terminal INCLK of the clock generating circuit 2, for example, from a quartz oscillator, while the clock signal is outputted from an output terminal ACLK and inputted to an input terminal A1CLK of the core A. The clock signal is also outputted from an output terminal BCLK of the clock generating circuit 2 and inputted to an input terminal B1CLK of the core B. Incidentally, the internal configurations of the core A and the core B are the same as those in FIG. 3 and FIG. 4 described above.

An output terminal OUTA of the core A is connected to an input terminal INB of the core B, and an output terminal OUTB of the core B is connected to an input terminal INA of the core A. Thereby, data is delivered between the core A and the core B.

A power supply voltage PW is supplied to this semiconductor integrated circuit, for example, from the outside, and this power supply voltage is supplied as it is to the clock generating circuit 2, the power supply circuit 20, and the core B. The power supply circuit 20 can select whether to supply the power supply voltage PW as it is to the core A or to transform the power supply voltage PW and then supply the transformed power supply voltage to the core A. This selection is performed by a control signal CTL inputted to an input terminal ACTNL2. The power supply voltage from the power supply circuit 20 is supplied to the core A via an output terminal AVDD.

In this embodiment, the power supply voltage PW is 1.25 V, and the power supply voltage transformed by the power supply circuit 20 is 1.00 V. As is known from the above, the core B operates at 1.25 V, whereas the core A operates at either 1.25 V or 1.00 V. The control signal CTL inputted to the input terminal ACNTL2 of the power supply circuit 20 controls which of power supply voltages is supplied from the power supply circuit 20 to the core A.

Figure 6:
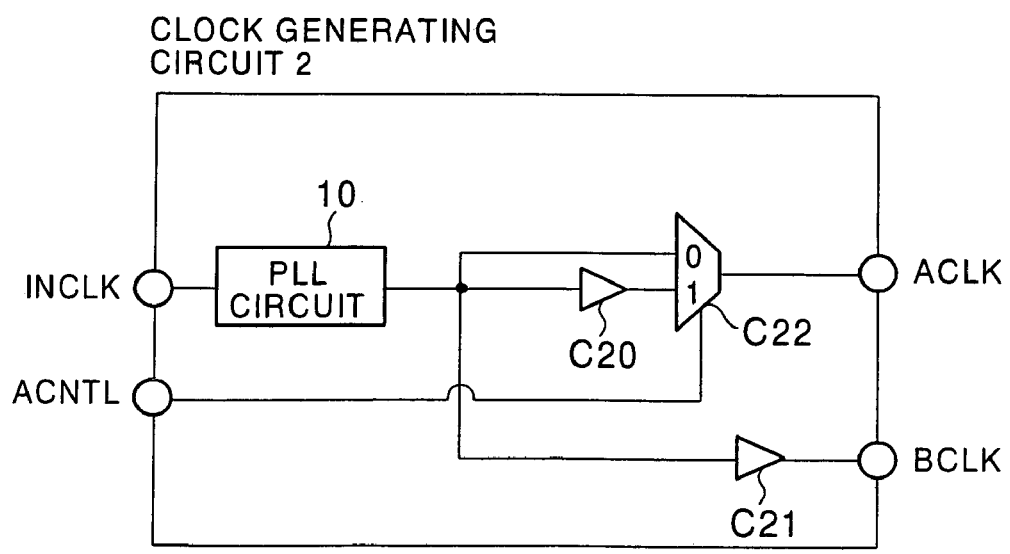
FIG. 6 is a block diagram showing the configuration of a clock generating circuit in the semiconductor integrated circuit in FIG. 5.

FIG. 6 is a block diagram showing the internal configuration of the clock generating circuit 2. As shown in FIG. 6, the clock generating circuit 2 according to this embodiment includes a PLL (Phase Locked Loop) circuit 10, buffers C20 and C21, and a selector C22. Out of these elements, the buffers C20 and C21 and the selector C22 constitute a clock skew reducing circuit in this embodiment.

The clock signal outputted from the PLL circuit 10 is inputted as it is to the selector C22 and simultaneously inputted to the selector C22 via the buffer C20. The control signal CTL is also inputted to the selector C22 via an input terminal ACNTL. Therefore, either the clock signal inputted as it is or the clock signal inputted via the buffer C20 is outputted from the selector C22 according to whether the control signal CTL is "0" or "1". The clock signal outputted from the selector C22 is supplied to the core A via the output terminal ACLK. On the other hand, the clock signal outputted from the PLL circuit 10 is also supplied from the output terminal BCLK to the core B via the buffer C21.

In the semiconductor integrated circuit thus configured, the following operation is performed. For example, when the core A is operated at 1.00 V, the control signal CTL is set to "0". In this case, the selector C22 outputs the clock signal outputted directly from the PLL circuit 10. Hence, a clock signal system is designed so that the propagation delay of the clock signal before it arrives at flip-flop circuits A11 and A12 from the PLL circuit 10 through the selector C22 and the propagation delay of the clock signal before it arrives at flip-flop circuits B11 and B12 from the PLL circuit 10 through the buffer C21 become equal to each other.

In contrast, when the core A is operated at 1.25 V, the control signal CTL is set to "1". In this case, the selector C22 outputs the clock signal outputted from the buffer C20. Hence, the clock signal system is designed so that the propagation delay of the clock signal before it arrives at the flip-flop circuits A11 and A12 from the PLL circuit 10 through the buffer C20 and the selector C22 and the propagation delay of the clock signal before it arrives at the flip-flop circuits B11 and B12 from the PLL circuit 10 through the buffer C21 become equal to each other.

Namely, the design is worked out so that a propagation delay difference of the clock signal when the power supply voltage of the core A changes from 1.00 V to 1.25 V and a delay value of the buffer C20 become equal. In other words, the buffer C21 is set in such a manner that the propagation delay of the clock signal in the core A when the clock signal whose delay time before the clock signal arrives at the selector C22 is the shortest is selected and the propagation delay of the clock signal when it arrives at the core B through the buffer C21 match.

Thanks to the aforementioned design, even if either a power supply voltage of 1.25 V or a power supply voltage of 1.00 V is supplied to the core A, the occurrence of clock skew between the flip-flop circuits A11 and A12 and the flip-flop circuits B11 and B12 can be suppressed by switching the control signal CTL.

As a result, even when the power supply voltage to be supplied to a part of cores in the semiconductor integrated circuit is decreased to reduce power consumption, the occurrence of clock skew can be suppressed. Consequently, setup time/hold time violations which occur between a core whose voltage is decreased and a core whose voltage is not decreased can be reduced.

Second Embodiment

In the aforementioned first embodiment, the core A is designed in an alternative manner so as to operate at either 1.25 V or 1.00 V. However, in some cases, there are many power supply voltages to be supplied to the core A, and in other cases, the power supply voltage cannot be determined at the time of designing. Hence, in this embodiment, by providing a DLL circuit in the clock generating circuit and automatically adjusting a difference between an edge of the clock signal in the core A and an edge of the clock signal in the core B, it becomes unnecessary to determine the power supply voltage when the semiconductor integrated circuit is designed. Further details will be given below.

Figure 7:
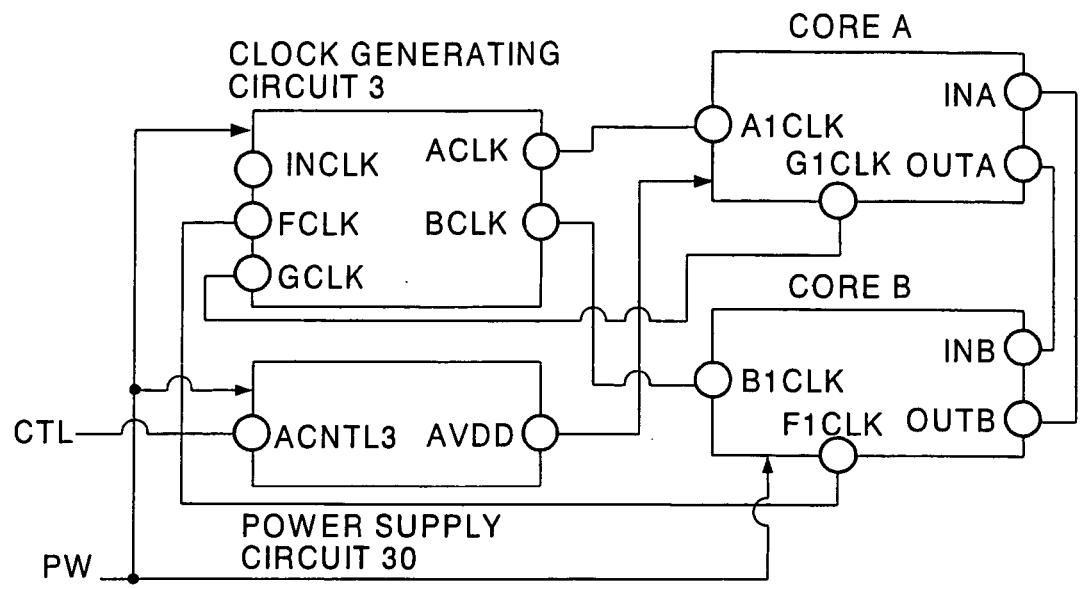
FIG. 7 is a block diagram showing the configuration of a semiconductor integrated circuit according to a second embodiment.

FIG. 7 is a block diagram showing the configuration of a semiconductor integrated circuit according to this embodiment. In the example in FIG. 7, the semiconductor integrated circuit includes a clock generating circuit 3, a power supply circuit 30, a core A, and a core B.

The clock generating circuit 3 generates a clock signal and supplies the clock signal to the core A and the core B. Namely, a high-frequency signal is inputted to an input terminal INCLK of the clock generating circuit 3, for example, from a quartz oscillator, while the clock signal is outputted from an output terminal ACLK and inputted to an input terminal A1CLK of the core A. The clock signal is also outputted from an output terminal BCLK of the clock generating circuit 3 and inputted to an input terminal B1CLK of the core B.

An output terminal OUTA of the core A is connected to an input terminal INB of the core B, and an output terminal OUTB of the core B is connected to an input terminal INA of the core A. Thereby, data is delivered between the core A and the core B.

Moreover, a feedback clock signal of the core A is outputted from an output terminal G1CLK of the core A and inputted to an input terminal GCLK of the clock generating circuit 3. A feedback clock signal of the core B is outputted from an output terminal F1CLK of the core B and inputted to an input terminal FCLK of the clock generating circuit 3.

A power supply voltage PW is supplied to this semiconductor integrated circuit, for example, from the outside, and this power supply voltage is supplied as it is to the clock generating circuit 3, the power supply circuit 30, and the core B. A control signal CTL is inputted to an input terminal ACNTL 3 of the power supply circuit 30. This control signal CTL controls the value of the power supply voltage to be supplied to the core A, and in this embodiment, the value of the power supply voltage which the power supply circuit 30 supplies to the core A changes steplessly according to the control signal CTL. In other words, by using the power supply circuit 30, it becomes possible to supply any given power supply voltage to the core A according to the control signal CTL.

Figure 8:
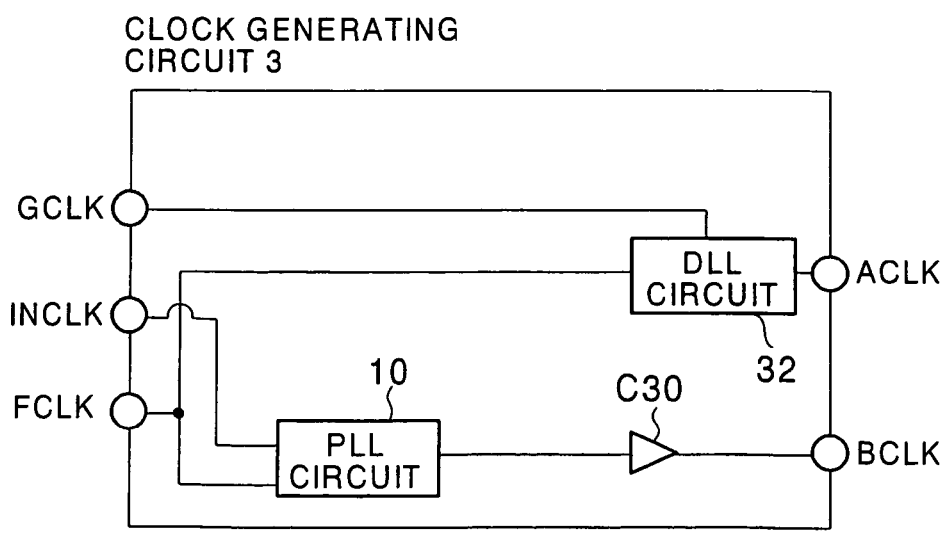
FIG. 8 is a block diagram showing the configuration of a clock generating circuit in the semiconductor integrated circuit in FIG. 7.
Figure 9:
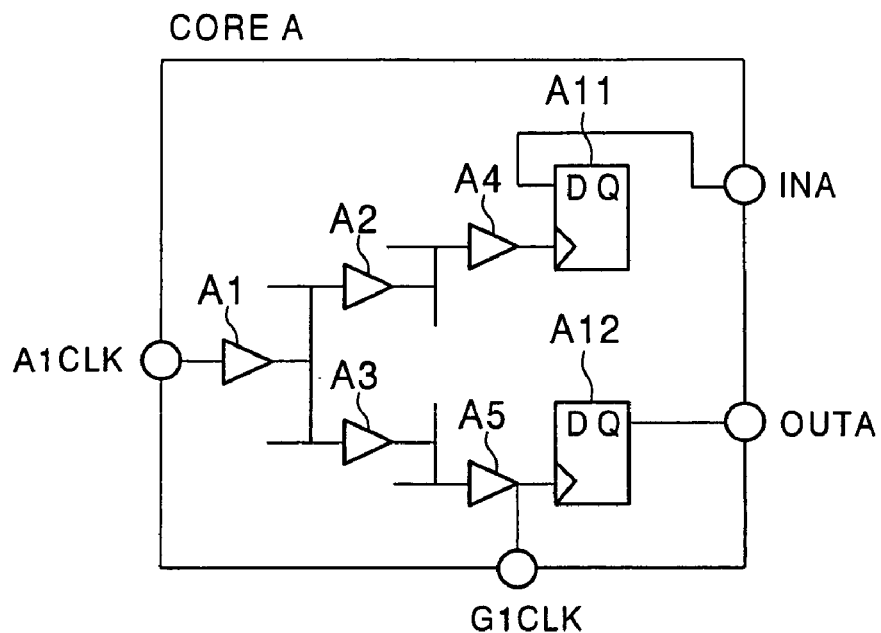
FIG. 9 is a block diagram showing a clock supply system inside one core in the semiconductor integrated circuit in FIG. 7.
Figure 10:
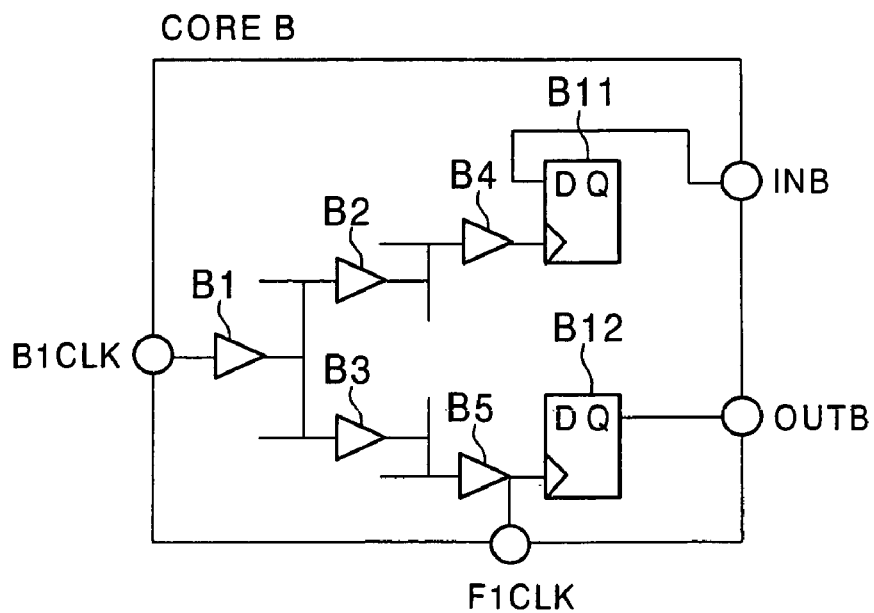
FIG. 10 is a block diagram showing a clock supply system inside another core in the semiconductor integrated circuit in FIG. 7.

FIG. 8 is a block diagram showing the internal configuration of the clock generating circuit 3, FIG. 9 is a block diagram showing a clock supply system inside the core A, and FIG. 10 is a block diagram showing a clock supply system inside the core B.

As shown in FIG. 8, the clock generating circuit 3 according to this embodiment includes a PLL (Phase Locked Loop) circuit 10, a buffer C30, and a DLL (Delay Locked Loop) circuit 32. Out of these elements, the DLL circuit 32 constitutes a clock skew reducing circuit in this embodiment.

As shown in FIG. 9, the clock signal inputted from the input terminal A1CLK is inputted to a flip-flop circuit A11 via buffers A1, A2, and A4, and simultaneously inputted to a flip-flop circuit A12 via buffers A1, A3, and A5. Moreover, immediately before being inputted to the flip-flop circuit A12, the clock signal is outputted as the feedback clock signal from the output terminal G1CLK and inputted to the input terminal GCLK of the clock generating circuit 3 in FIG. 8.

As shown in FIG. 10, the clock signal inputted from the input terminal B1CLK is inputted to a flip-flop circuit B11 via buffers B1, B2, and B4, and simultaneously inputted to a flip-flop circuit B12 via buffers B1, B3, and B5. Moreover, immediately before being inputted to the flip-flop circuit B12, the clock signal is outputted as the feedback clock signal from the output terminal F1CLK and inputted to the input terminal FCLK of the clock generating circuit 3 in FIG. 8.

As shown in FIG. 8, the feedback clock signals inputted from the input terminal FCLK and the input terminal GCLK are both inputted to the DLL circuit 32. The DLL circuit 32 automatically adjusts edges of these two feedback clock signals. Namely, a clock signal to be outputted from the DLL circuit 32 is adjusted in such a manner that edges of a clock signal which is outputted from the PLL circuit 10 via the buffer C30 and arrives at the flip-flop circuit B12 and a clock signal which is outputted from the DLL circuit 32 and arrives at the flip-flop circuit A12 are synchronized. Therefore, no matter what value the power supply voltage supplied from the power supply circuit 30 to the core A changes to, the DLL circuit 32 automatically reduces the clock skew between the core A and the core B.

It should be mentioned that the present invention is not limited to the aforementioned embodiments, and various changes may be made therein. For example, in the aforementioned first embodiment, the power supply circuit 20 generates two kinds of power supply voltages and supplies them to the core A, but it may generate and supply more than two kinds of power supply voltages. Namely, the power supply circuit 20 may change the previously set power supply voltage stepwise and supply the stepwise changed power supply voltage.

In this case, the selector C22 is required to select one clock signal from plural clock signals and output it according to the change performed by the power supply circuit 20. For this purpose, plural clock signals with different propagation delays need to be inputted to the selector C22. Delay times of the clock signals before they are inputted to the selector C22 need to be designed properly so that the clock skew between the core A and the core B is reduced.

The buffers used in the aforementioned respective embodiments are an example of delay elements for the clock signal and can be realized also by other elements which have a comparable function.

What is claimed is:

1. A semiconductor integrated circuit, comprising:
a first core which realizes a predetermined function;
a second core which is different from the first core and realizes a predetermined function;
a power supply circuit which is capable of supplying, to the first core, a power supply voltage different from that supplied to the second core; and
a clock generating circuit which supplies a clock signal to each of the first core and the second core, the clock generating circuit including a clock skew reducing circuit which reduces clock skew occurring between the clock signal in the first core and the clock signal in the second core.

2. The semiconductor integrated circuit according to claim 1, wherein the power supply voltage which the power supply circuit supplies to the first core changes stepwise.

3. The semiconductor integrated circuit according to claim 2, wherein the clock generating circuit comprises a basic clock signal generating circuit which generates a basic clock signal.

4. The semiconductor integrated circuit according to claim 3, wherein the clock skew reducing circuit comprises a selector to which plural clock signals with different propagation delays generated from the basic clock signal are inputted and which selectively outputs one clock signal to the first core according to the change of the power supply voltage.

5. The semiconductor integrated circuit according to claim 4, wherein the propagation delays of the plural clock signals inputted to the selector are set so that when the first core operates at the respective power supply voltages supplied by the power supply circuit, the clock skew between the clock signal supplied to the first core and the clock signal supplied to the second core is suppressed.

6. The semiconductor integrated circuit according to claim 5, wherein a delay time of the clock signal to be outputted to the second core is set in accordance with the clock signal which arrives at the first core in a case where the selector selects a clock signal with the shortest delay time.

7. The semiconductor integrated circuit according to claim 6, wherein the setting of the delay time is performed by providing one or plural delay elements in the clock skew reducing circuit.

8. The semiconductor integrated circuit according to claim 1, wherein the power supply voltage which the power supply circuit supplies to the first core is allowed to be set optionally.

9. The semiconductor integrated circuit according to claim 8, wherein the clock generating circuit comprises a basic clock signal generating circuit which generates a basic clock signal.

10. The semiconductor integrated circuit according to claim 9, wherein the clock signal which has arrived at the first core is inputted as a first feedback clock signal to the clock skew reducing circuit, the clock signal which has arrived at the second core is inputted as a second feedback clock signal to the clock skew reducing circuit, edges of the first feedback clock signal and the second feedback clock signal are automatically adjusted, and a clock signal is outputted to the first core.

11. The semiconductor integrated circuit according to claim 10, wherein the first feedback clock signal is the clock signal having passed through the first core and the second feedback clock signal is the clock signal having passed through the second core.

* * * * *